United States Patent [19]

Guckel et al.

[11] Patent Number: 4,853,669
[45] Date of Patent: Aug. 1, 1989

[54] SEALED CAVITY SEMICONDUCTOR PRESSURE TRANSDUCERS AND METHOD OF PRODUCING THE SAME

[75] Inventors: Henry Guckel; David W. Burns, both of Madison, Wis.

[73] Assignee: Wisconsin Alumni Research Foundation, Madison, Wis.

[21] Appl. No.: 174,821

[22] Filed: Mar. 29, 1988

Related U.S. Application Data

[60] Division of Ser. No. 855,806, Apr. 24, 1986, Pat. No. 4,744,863, which is a continuation-in-part of Ser. No. 727,909, Apr. 26, 1985, abandoned.

[51] Int. Cl.$^4$ .................................................. G01L 1/22
[52] U.S. Cl. ...................................... 338/4; 156/653; 338/42
[58] Field of Search ............................ 338/2, 4, 5, 42; 29/621.1; 357/26; 156/653, 651, 657, 655; 427/93, 94, 105

[56] References Cited

U.S. PATENT DOCUMENTS

| | | | |
|---|---|---|---|
| 3,489,995 | 1/1970 | Laurent | 340/14 |
| 3,634,727 | 1/1972 | Polye | 357/26 |
| 3,681,134 | 8/1972 | Nathanson et al. | 29/626 |
| 3,748,571 | 7/1973 | Kurtz | 323/74 |
| 3,853,650 | 12/1974 | Hartlaub | 156/13 |
| 3,886,584 | 5/1975 | Cook, Jr. et al. | 357/23 |
| 3,900,597 | 8/1975 | Chruma et al. | 427/82 |
| 4,064,549 | 12/1977 | Cretzler | 361/283 |
| 4,168,518 | 9/1979 | Lee | 361/283 |
| 4,203,128 | 5/1980 | Guckel et al. | 357/60 |
| 4,208,782 | 6/1980 | Kurtz et al. | 29/580 |
| 4,234,361 | 11/1980 | Guckel et al. | 148/186 |
| 4,240,196 | 12/1980 | Jacobs et al. | 29/578 |
| 4,262,399 | 4/1981 | Cady | 29/25.42 |
| 4,356,211 | 10/1982 | Riseman | 427/85 |
| 4,371,890 | 2/1983 | Anagnostopoulos et al. | 357/59 |
| 4,384,899 | 5/1983 | Myers | 148/1.5 |
| 4,386,453 | 6/1983 | Giachino et al. | 29/25.41 |
| 4,415,948 | 11/1983 | Grantham et al. | 361/283 |
| 4,428,796 | 1/1984 | Milgram | 156/637 |
| 4,471,525 | 9/1984 | Sasaki | 29/576 W |
| 4,502,917 | 3/1985 | Chamberlin | 156/645 |
| 4,528,855 | 7/1985 | Singh | 73/721 |
| 4,592,238 | 6/1986 | Busta | 73/727 |

FOREIGN PATENT DOCUMENTS 306980 6/1971 U.S.S.R. .

OTHER PUBLICATIONS

Guckel, H. and D. W. Burns, "A Technology for Integrated Transducers", Proceedings of the International Conference of Sensors and Actuators–Transducers '85, pp. 90–92, Philadelphia, Pennsylvania, Jun. 1985.

(List continued on next page.)

Primary Examiner—C. L. Albritton
Attorney, Agent, or Firm—Lathrop & Clark

[57] ABSTRACT

Sealed cavity structures suitable for use as pressure transducers are formed on a single surface of a semiconductor substrate (20) by, for example, deposit of a polycrystalline silicon layer (32) from silane gas over a relatively large silicon dioxide post (22) and smaller silicon dioxide ridges (27) leading outwardly from the post. The polysilicon layer is masked and etched to expose the outer edges of the ridges and the entire structure is then immersed in an etchant which etches the silicon dioxide forming the ridges and the post but not the substrate (20) or the deposited polysilicon layer (32). A cavity structure results in which channels (35) are left in place of the ridges and extend from communication with the atmosphere to the cavity (36) left in place of the post. The cavity (36) may be sealed off from the external atmosphere by a second vapor deposition of polysilicon or silicon nitride, which fills up and seals off the channels (35), or by exposing the substrate and the structure thereon to an oxidizing ambient which results in growth of silicon dioxide in the channels sufficient to seal off the channels. Deflection of the membrane spanning the cavity occurring as a result of pressure changes, may be detected, for example, by piezoresistive devices formed on the membrane.

13 Claims, 8 Drawing Sheets

OTHER PUBLICATIONS

H. Guckel, et al., "Planar Process, Integrated Displacement Sensors", in *Micromachining and Micropackagaing of Transducers*, C. D. Fung, et al. Ed, published Jan. 1986, Elsevier Science Publishers B.V., Amsterdam, Holland, pp. 199–203, Presented orally Nov., 1984 at Workshop in Micromachining and Micropackaging, Case Western University, Cleveland, Ohio.

Guckel, H. and D. W. Burns, "Planar Processed Polysilicon Sealed Cavities for Pressure Transducer Arrays", Proceedings of IEEE International Electron Devices Meeting, pp. 223–225, San Francisco, Cal., Dec. 1984.

H. Guckel, et al., "Laser-Recrystallized Pierzoresistive Micro-Diaphragm Sensor", Proceedings of International Conference on Sensors and Actuators–Transducers '85, pp. 1982–1985, Philadelphia, Pa., Jun. 1985.

Howe, R. T., Ph.D., Dissertation entitled "Integrated Silicon Electromechanical Vapor Sensor," University of California, dated May 30, 1984.

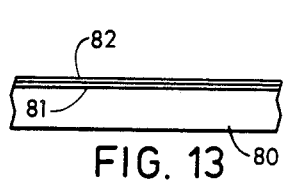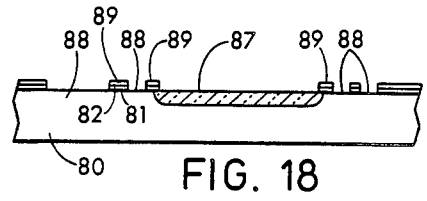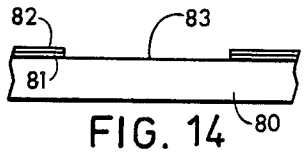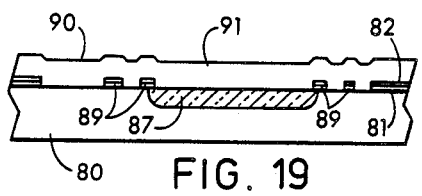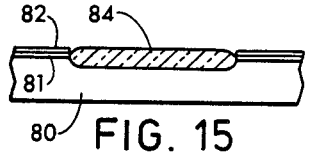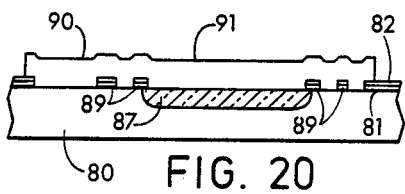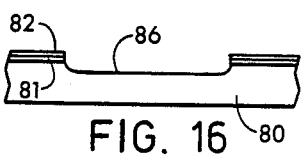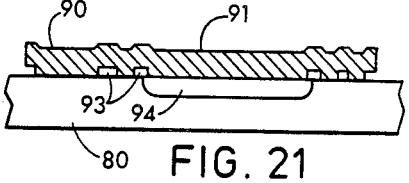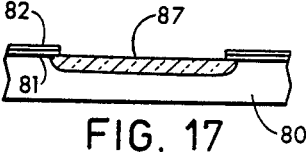

4,853,669

SEALED CAVITY SEMICONDUCTOR PRESSURE TRANSDUCERS AND METHOD OF PRODUCING THE SAME

CROSS REFERENCE TO RELATED APPLICATION

This application is a division of application Ser. No. 858,806 filed Apr. 24, 1986, now U.S. Pat. No. 4,744,863, which is a continuation-in-part of application Ser. No. 727,909 filed Apr. 26, 1985, abandonded which is incorporated herein by reference.

FIELD OF THE INVENTION

This invention pertains generally to the field of semiconductor devices and processing techniques and particularly to pressure and displacement transducers formed on semiconductor substrates.

BACKGROUND OF THE INVENTION

Significant advances have been made in the miniaturizaton of electronic components, resulting in reduced component cost as well as size. Modern integrated circuit technology allows very small but complex circuits to be formed using mass production techniques on silicon and other substrates. Consequently, for applications such as pressure and force sensing, the transducers required to interface the electronic circuitry with the ambient environment typically occupy much greater volume and are much more costly than the electronic components used to process the signal from the transducers.

Displacement transducers are three-dimensional electro-mechanical structures which electronically monitor geometric deformation to measure applied forces. Pressure transducers are displacement transducers in which the displacement is caused by a differential in pressure across a deformable barrier, adding the requirement that a reference pressure be maintained on one side of the barrier. Present commercial pressure transducers are relatively large, discrete devices, typically formed utilizing a metal diaphragm as the pressure barrier. To minimize cost and size of components, as well as to reduce the packaging and fabrication costs of processing circuitry, it would be desirable to incorporate the pressure tranducer, or multiple transducers, directly on or in the substrate on which the electronic processing circuitry is formed. However, the physical structure required for a pressure transducer is not easily realized using conventional integrated circuit processing techniques.

It is possible to form pressure transducers in silicon substrates by selective etching of the substrate until the etch is terminated by a highly doped layer to form a thin membrane, and thereafter bonding another member over the membrane to define a cavity. Examples of such structures are shown in the patent to Guckel, et al., U.S. Pat. No. 4,203,128. While such structures are useful, their production requires processing steps not utilized in ordinary integrated circuit processing in which the electronic components are formed on only one side of the substrate. The heavy doping of one surface of the substrate required to provide the etch stop layer also imposes limitations on the ability to form electronic components on the doped surface using conventional deposition techniques.

SUMMARY OF THE INVENTION

In accordance with the present invention, structures with deformable membranes spanning sealed cavities can be formed on one side of a semiconductor substrate using conventional integrated circuit processing techniques. These cavity structures can be used as pressure sensors and are formed in a manner which does not affect the capability of the substrate to have electronic circuit components formed thereon, thereby allowing full integration of pressure sensors with processing circuitry on a single semiconductor chip.

The method of producing the cavity sensors on a substrate such as crystalline silicon involves the initial step of forming a post of an etchable material such as silicon dioxide to a selected height and shape on a surface of the substrate. Etchable silicon dioxide ridges of lower height than the post are then formed on the substrate surface extending inwardly to contact with the post. A structural material is then deposited from a vapor in a layer over the ridges and the post so that the deposited layer contacts the top surface of the substrate in peripheral areas surrounding the post between the ridges. Polycrystalline silicon deposited by low pressure chemical vapor deposition provides a deposited layer which has particularly advantageous electrical and structural properties. The outer periphery of the deposited layer may be cut away to expose the ends of the silicon dioxide ridges; the substrate is then placed in a bath of etchant which etches into the ridges, but not the substrate or the deposited layer, and eventually etches into the post area to remove the same and leave a cavity in its place. When the etchant is withdrawn, the deposited layer remains bonded to the substrate at peripheral areas surrounding the portion thereof raised over the cavity. Channels in the former position of the ridges extend from the cavity to the external atmosphere.

If it is desired to seal off the cavity from the ambient atmosphere, the substrate is exposed to a gas or vapor atmosphere which causes growth of material in the channels sufficient to close them off. In one sealing technique, the substrate is exposed to silicon in gaseous form, such as silane, causing a polysilicon layer to grow on all exposed surfaces, including the interior surfaces of the cavity and channels. Eventually, sufficient polysilicon grows on the channel surfaces to completely close them off and prevent further passage of silane gas into the cavity. The silane trapped in the cavity continues to deposit polysilicon on the walls of the cavity until the silane gas is exhausted. In another technique, the substrate is exposed to an oxidizing ambient which causes the exposed silicon surfaces to form silicon dioxide thereon which grows outwardly to eventually close off the channels. The remaining oxidizing gas trapped in the cavity will continue to oxidize the surfaces of the cavity, forming silicon dioxide on them, until the oxygen in the cavity is exhausted. In either technique, the pressure of the residual gas trapped in the cavity can be controlled by mixing the reactive gas to which the substrate is exposed with a selected quantity of nonreactive gas, e.g., nitrogen or argon.

The deposited material forming the membrane which spans the cavity can be made structurally strong and flexible at microcircuit dimensions and impermeable to atmospheric gases. The magnitude of residual strain in the membrane may be controlled by appropriate annealing cycles to yield a desired strain level. Polysilicon is particularly desirable for forming such membranes since it may be doped to desired conductivity levels to form strain sensitive devices which can be used to detect the deflections of the membrane. However, the cavity structures may also be formed with other material depositable from a gas phase, such as silicon nitride, an excellent insulator. Desired circuit structures can be formed by deposit of appropriate semiconductor material onto the silicon nitride membrane A layer of silicon nitride, or other insulating material, may also be deposited on the outer surface of a membrane formed of a more conductive material, e.g., polysilicon, providing an excellent insulating surface on which electrically isolated circuit elements (e.g., piezoresistive polysilicon resistors) may be formed and provides control of the overall strain in the composite membrane.

Further objects, features, and advantages of the invention will be apparent from the following detailed description when taken in conjunction with the accompanying drawings.

BRIEF DESCRIPTION OF THE DRAWINGS

In the drawings:

FIGS. 13-33 are cross-sectional views through a substrate illustrating the sequential processing steps in the formation of pressure sensor which has a polysilicon membrane with a silicon nitride surface layer on which piezoresistive elements are formed.

DESCRIPTION OF THE PREFERRED EMBODIMENT

Figure 1:
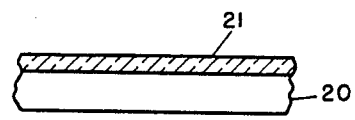
FIG. 1 is a cross-sectional view through a silicon substrate on which a layer of silicon dioxide has been formed.
Figure 3:
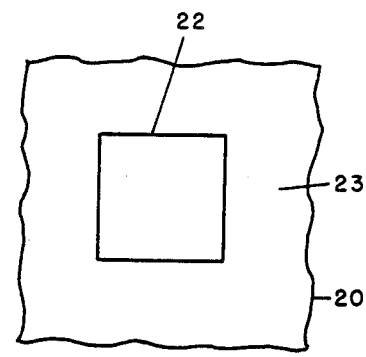
FIG. 3 is a partial plan view of the substrate and post of FIG. 2.
Figure 2:
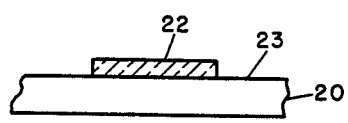
FIG. 2 is a cross-sectional view as in FIG. 1 showing the formation of a post on the substrate.
Figure 4:
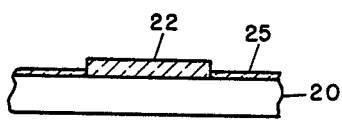
FIG. 4 is a cross-sectional view through the substrate after deposit of a second, thinner layer of silicon dioxide on the substrate.

With reference to the drawings, the processing steps which may be utilized to produce sealed cavity structures in accordance with the invention are illustrated in sequence in FIGS. 1-10. The initial step in the production involves the formation on a semiconductor substrate 20, typically of crystalline silicon, of an oxide layer 21 to a depth equivalent to the desired height of the cavity. As shown in FIG. 2, the oxide layer 21 is then masked with an etch resist in a central area and an etchant applied to etch away the material outside the central area. A central post 22 of silicon dioxide remains after etching, with the top surface 23 of the substrate 20 exposed in the area surrounding the post 22, as illustrated in the plan view of the substrate in FIG. 3. The post 22 is illustrated in FIG. 3 as having a square lateral configuration, although it should be understood that virtually any configuration for the post may be utilized.

The next step in the processing involves the masking of the top surface of the post 22 and the formation of a second oxide layer 25 on the surface of the substrate 20 in the area surrounding the post. Removal of the resist layer from the top of the post provides the structure of FIG. 4 in which the second oxide layer 25 is formed up to the post 22 but at a height substantially less than the height of the post. For illustrative purposes, the height of the second oxide layer 25 is shown as being a substantial portion of the height of the post 22 although, for the reasons explained further below, it is desirable that the post be ten to twenty times higher than the second silicon dioxide layer 25. Typical suitable post heights are in the range of 1,000 angstroms to 5 microns, while the second silicon dioxide layer is preferably formed to a thickness of 200 to 1,000 angstroms.

Figure 5:
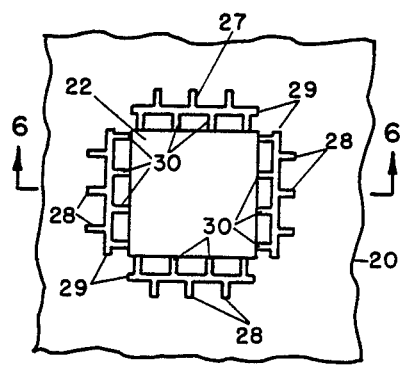
FIG. 5 is a plan view of the pattern of ridges formed by selective masking and etching in the lower silicon dioxide layer which extend toward the post.

The next processing step involves the placement of a mask (not shown), onto the silicon dioxide layer 25 to expose a pattern thereon which, after the application of an etchant to the exposed material, leaves intact the central post 22 and a network of ridges 27 extending from the central post 22 to peripheral areas, as illustrated in FIG. 5. The pattern of ridges 27 preferably includes first inwardly extending ridges 28 which meet at their inner ends a laterally extending ridge 29. Second inwardly extending ridges 30 meet the lateral ridge 29 at positions away from the positions at which the first ridges 28 meet the ridge 29, and the inner ridges 30 extend into contact with the outer periphery of the central post 22. For reasons noted below, the pattern of ridges 27 which extend inwardly to meet the post 22 preferably do not extend in a straight line, but rather have the branched configuration defined by the ridges 28, 29 and 30.

Figure 7:
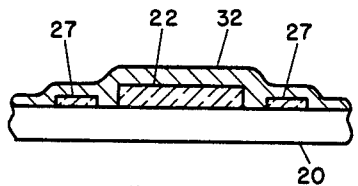
FIG. 7 is a cross-sectional view of the substrate with a layer of deposited material over the ridges and the post.

The substrate with the post 22 and the ridges 27 formed thereon is now exposed to a gas which will result in the deposit of a solid material onto both the substrate and the silicon dioxide on the substrate in a structurally cohesive layer, as illustrated at 32 in FIG. 7. The deposited layer 32 should be structurally cohesive and flexible at microcircuit dimensions (e.g., 1,000 angstroms to 15 microns thick, 50 to 1,000 microns or more in lateral dimension) and have, or be treatable to have relatively low strain which is preferably tensile. The material of the layer 32 should also be substantially impermeable to atmospheric gases if the final structure is to be used as a pressure sensor. The deposited layer should also bond well to the substrate surface and preferably has resistance to common etchants similar to the etch resistance of the substrate. Examples of suitable materials for the deposited layer are polycrystalline silicon (polysilicon), deposited from silane gas ($SiH_4$), and silicon nitride or aluminum deposited from vapor phases of these materials. The portion of the deposited layer 32 which overlays the post 22 and the ridges 27 is then covered with an etch resist and an etchant is applied to etch away all areas of the deposited layer outside of the etch resist mask.

Figure 8:
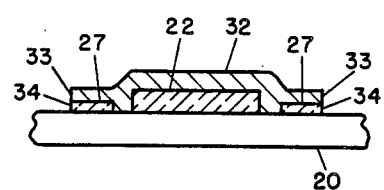
FIG. 8 is a cross-section as in FIG. 7 after the periphery of the deposited layer is cut away to expose the outer ends of the ridges.

After the removal of the mask, the structure shown in FIG. 8 remains in which the layer 32 extends outwardly to a terminal wall 33 at which the outer ends 34 of the ridges 27 are exposed. The structure is then immersed in a suitable etchant (e.g., hydrofluoric acid for silicon dioxide, which does not attack crystalline silicon or polysilicon) which begins etching the ridges at their exposed ends 34. The entire space of the ridges 27 is etched out, leaving channels 35 in their place, and the etchant proceeds inwardly to the post 22 to etch it out, leaving a cavity 36 defined between the top surface 23 of the substrate and the inner surface of the central membrane portion 37 of the deposited layer 32. This forms a completed cavity structure in which the membrane 37 may be used to detect forces impinging thereon. If it is to be used as pressure sensor, however, it is preferred that the internal cavity 36 be sealed from the ambient atmosphere. This may be done by exposing the substrate and the deposited layer 32 either to an oxidizing ambient or to a further vapor deposition of material. In both processes, a layer 40 of solid material builds up on all exposed surfaces of the deposited layer 32 and the surface 23 of the substrate 20, including the interior surfaces of the channels 35 and the cavity 36. Because the channels 35 are much lower than the height of the cavity 36 (e.g., 1/10 to 1/20 of the height of the cavity), the accumulating layer of material on the channel walls will rapidly fill up and close off the channels before the growing layer on the interior walls of the cavity 36 has occupied a substantial portion of the cavity. The channels must be low enough to fill with the solid reaction product of the gas in a reasonably short period of time while being large enough to allow the etchant liquid to flow through during the etch procedure. Channel heights of 200 to 1,000 angstroms are generally suitable for a deposited layer of polysilicon.

The depositing gas trapped in the cavity 36 when the channels 35 close off will continue to react and deposit on the walls of the cavity until exhausted, after which the cavity 36 will be completely sealed off from ambient atmosphere and no further reactions will take place. The pressure inside the sealed cavity 36 may be controlled by mixing the reacting gas with an inert gas in a desired proportion so that when the reacting gas within the cavity has exhausted itself, the remaining inert gas will provide the desired gas reference pressure within the cavity.

Figure 9:
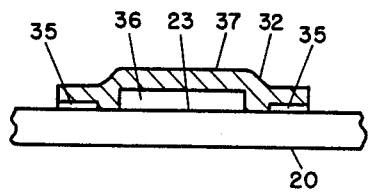
FIG. 9 is a cross-sectional view as in FIG. 8 after application of etchant to the structure to form the cavity under the deposited layer.
Figure 10:
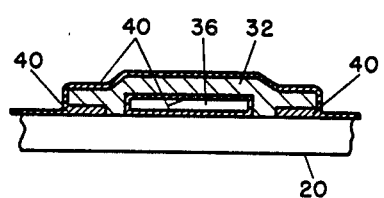
FIG. 10 is a cross-sectional view as in FIG. 9 after sealing of the channels with a vapor deposited material.

The purpose of the branching pattern of the ridge portions 28, 29 and 30 is most apparent with respect to the cross-section of FIG. 9, in which the ridges are replaced by the channels 35. If the channels 35 extended straight to the cavity, the polysilicon over the channels could more easily deform into the shallow channels as the supporting oxide ridges 27 are removed. Moreover, the branched structure of the channels will allow the depositing material in the gas to more quickly fill up and block off the channels than if they were straight, and will generally provide a more gas-tight seal in the channels. In addition, the deposited layer 32 is in contact with the top surface of the substrate 23 at the peripheral areas between the channels 35 at all positions surrounding the periphery of the cavity 36, thereby providing a firmer supporting foundation for the membrane above the cavity. This peripheral foundation is less likely to debond from the substrate surface during processing and when the deposited layer 32 is placed under strain.

The foregoing procedure may be carried out on the surface of a large substrate to batch produce many deposited cavity structures simultaneously. The substrate may then be severed in accordance with conventional techniques to isolate each cavity on a single chip, or several of the cavities may be maintained together on a chip to provide various desired sensor characteristics. For example, several sensor cavity structures may be formed on a single substrate, each having cavities of differing dimensions and cavity spanning membranes 37 of various dimensions and thicknesses. These several structures may then be electrically interconnected to provide pressure sensing characteristics over a wider range or with greater sensitivity than would be possible with a single sensor.

Figure 11:
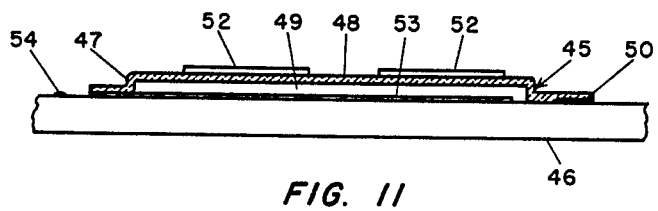
FIG. 11 is a cross-sectional view of a pressure sensor formed of the cavity structure of the invention.

A cross-section of a completed cavity sensor 45 on a substrate 46 is shown in FIG. 11. The substrate 46 has a deposited layer 47 which has a central membrane portion 48 spanning a cavity 49. The sealed channels in the periphery of the deposited layer 47 are illustrated at 50 in FIG. 11. The cavity 49 is sealed from the ambient atmosphere, resulting in deflection of the central membrane 48 as the ambient atmospheric pressure changes. This deflection can be sensed and converted to an electrical signal in various ways. If the deposited layer 47 is formed of polysilicon, the polysilicon itself can be doped to provide conductive strips (not shown in FIG. 11) in the membrane 48 which will change resistance in response to the strain in the membrane as it deflects. These strain sensing strips may then be connected to external processing circuitry to convert the detected changes in electrical characteristics to relative deflections of the membrane and thus to pressure changes. Alternatively, conductive strips 52 may be deposited on the outer surface of the membrane 48. The strips 52 can be formed as resistive strain gauges so that a deflection of the membrane 48 and the accompanying straining of the strips 52 can be detected by external circuitry. Such a structure is particularly suited for utilization when the deposited layer 47 is silicon nitride, a good insulator. For example, polysilicon strips may readily be formed on a silicon nitride membrane by a further chemical vapor deposition step, with the piezoresistive characteristics of polysilicon used to detect deflections of the membrane. A further alternative for sensing deflections of the membrane 48 is the formation of a conductive layer 53 on the surface of the substrate 46 which underlies the central membrane 48. The layer 53 would ordinarily be deposited or ion implanted prior to the formation of the deposited layer 47 on the substrate. The top surface of the membrane 48 may then be made conductive, as by vapor depositing a metal layer thereon, or by ion implanting the top surface of the membrane, such that the top surface of the membrane 48 and the layer 53 form two plates of a capacitor which will change capacitance in response to the deflections of the membrane 48. The conducting layer 53 may be extended outwardly to a contact 54 outside of the area occupied by the sensor structure 45 to allow electrical connection of the layer 53 to external circuitry.

Figure 12:
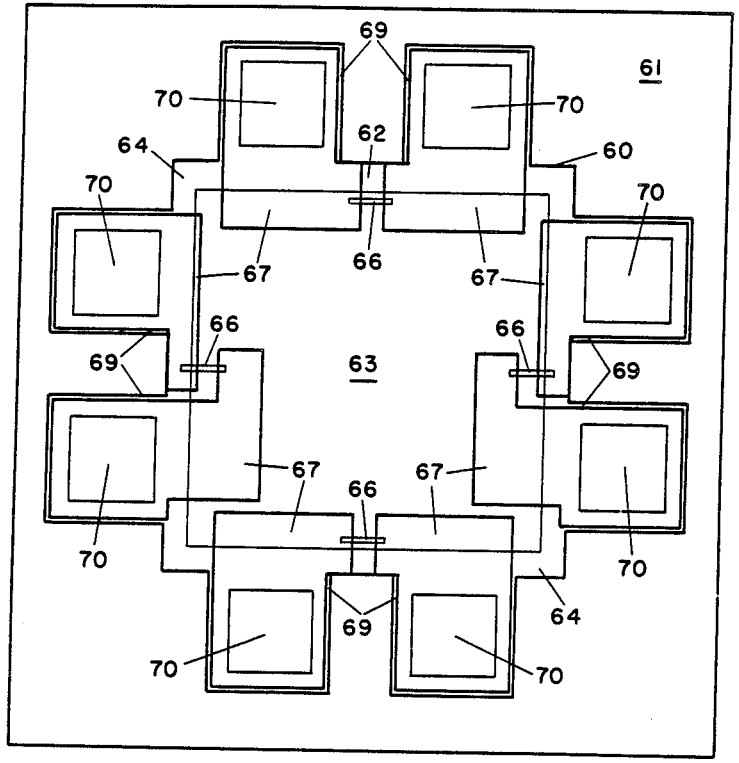
FIG. 12 is a plan view of a pressure sensor with strain sensitive resistors formed thereon.

A plan view is shown in FIG. 12 of a pressure sensor 60 formed on a crystalline silicon substrate 61. A deposited layer of polysilicon 62 has a square, central membrane portion 63 spanning a cavity and peripheral portions 64 which surround the cavity and have polysilicon filled channels extending therethrough (not shown in FIG. 12). Strain sensitive resistors are formed by lightly boron doping (with diffusion or ion implantation) four narrow strips 66 in the membrane 63 surface, two strips parallel and two strips perpendicular to the adjacent edge of the cavity under the membrane Heavily boron doped P+ regions 67 are formed by diffusion of boron into the polysilicon layer 62 to form highly conductive connections to the ends of the resistors 66. The conductive P+ regions extend out to outer pad portions 69 of the polysilicon layer 62. Metal pads 70 are formed on the pad portions 69 to allow connection of the resistors 66 in a bridge configuration. The lightly doped resistors 66 will change in resistance as a function of the strain in the membrane at the resistors, allowing deflections of the membrane 63 to be detected and measured.

As an example of the formation of sealed cavity structures as described above and illustrated in FIGS. 1-10, several cavity structures were formed in an array on a silicon crystal wafer. The formed cavities had substantially the configuration shown in FIG. 12, being square with dimensions from 50 microns to 250 microns on a side and having a cavity height of 1.5 microns. The channels leading to each cavity were formed to be 5 microns wide by 1,000 angstroms high.

A crystalline silicon wafer, P-type, 2 inches in diameter with <111>orientation, was used as the substrate 20. The substrate was first cleaned and then wet oxidized in an oxygen and water vapor ambient at 1150° C. for 4.5 hours to form an oxide layer 1.56 microns thick. The substrate was then subjected to an annealing cycle in nitrogen at 1150° C. for at least 20 minutes before applying a photoresist to the surface of the oxide layer (21 in FIG. 1). The mask defining the lateral shape of the post 22 was then aligned with the top of the substrate and an exposure made and the photoresist developed and post-baked. The undeveloped resist and underlying silicon dioxide was then etched away with Oxe-35 (hydrofluoric acid) etchant and thereafter the remaining photoresist covering the post was stripped away in a mixture of sulfuric acid and hydrogen peroxide.

The second oxidation to form the second layer 25 proceeds with an initial cleaning of the substrate and a wet oxidation at 1,000° C. for 10 minutes to provide an oxide layer approximately 1,200 angstroms thick, followed by annealing in nitrogen at 1,000° C. for a minimum of 20 minutes, application of photoresist to the exposed surfaces and a prebaking of the photoresist. The base level mask which defines the ridges 27 was then aligned, an exposure made and the photoresist developed and post-baked. The undeveloped photoresist and underlying silicon dioxide is then etched away and the photoresist stripped in the manner described above.

Figure 6:
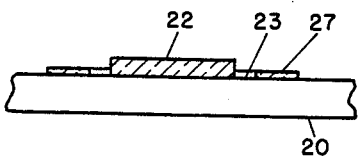
FIG. 6 is a cross-sectional view through the structure of FIG. 5 taken generally along the lines 6—6 of FIG. 5.

The layer 32 was then formed by deposition of polycrystalline silicon from silane gas. For example, to provide a polysilicon layer 32 with a thickness of approximately 1.5 micrometers, the patterned substrate, generally as shown in FIGS. 5 and 6, was exposed to 100% silane gas at a pressure of 150 milliTorr at approximately 635° C. for two hours. Following deposition of the polysilicon layer 32, the wafer was subjected to an annealing cycle, to reduce the strain level in the polysilicon, in a nitrogen atmosphere at approximately 1150° C. for three hours. After the annealing cycle was completed, photoresist was applied over the exposed surfaces and prebaked. A mask was then placed in alignment on the wafer which exposes the area of the layer 32 up to the outer edges 34 of the ridges, an exposure was made, and the photoresist developed and post-baked. The annealed polysilicon layer 32 was then etched with carbon tetrafluoride-oxygen plasma to remove all of the polysilicon under the undeveloped photoresist, and the remaining photoresist was thereafter stripped off to leave a structure as shown in FIG. 8 in which the outer ends 34 of the oxide ridges are exposed and will extend outwardly beyond the polysilicon layer 32. The substrate wafer was then immersed in concentrated hydrofluoric acid and etching was allowed to continue until all of the silicon dioxide was removed. Etch rates may be established by visual inspection with contrast microscopy, with overetching permitted. It may be noted that hydrofluoric acid will not wet oxide-free silicon surfaces. As a result, the etchant withdraws from the cavity interior via the etched channels when the completely etched wafer is wihhdrawn from the etchant. After completion of the silicon dioxide etch, the wafer was rinsed with alcohol and water for 15 minutes to eliminate any fluorine residues and then placed in a vacuum chamber and baked out at 0 to 50 milliTorr for 30 minutes.

Two alternative sealing techniques may be used to seal the channels 35. In the first technique, a wafer treated as described above was placed in an ambient of oxygen and water vapor at 850° C. for approximately 1 hour after which all etched channels were found to be closed by silicon dioxide grown from the surfaces of the channels. Such a sealing technique results in extremely smooth interior cavity surfaces which are covered by oxides much thinner than those on the exterior of the device. The seals are essentially mechanically perfect and excellent batch yields result. However, some increase in the strain field in the polysilicon membrane 37 occurs as a result of the oxidation.

In the second sealing technique, a wafer treated as described above was placed in a 100% silane ambient at approximately 635° C. and 150 milliTorr pressure for approximately 25 minutes after which all etched channels were found to be closed by a deposited layer of polysilicon. The polysilicon deposited in the channels fully sealed the cavity 36 from ambient.

Deflectible membranes 37 covering cavities 36 which are sealed by either of the foregoing techniques can be used for pressure sensing by forming electrical circuit elements on the membrane to detect its deflection. The polysilicon membranes formed by the above-described process are strong and flexible, having a measured tensile strength of approximately 200,000 psi. Annealing cycles are found to substantially reduce the strain in the polysilicon membranes, with a typical residual strain field being approximately 0.1% for polysilicon layers of 1.5 to 2 micron thickness. Slight variations in strain in the membranes occur with the level of doping in the membrane, but are small enough to allow high quality structures which are either doped or undoped. If desired, the polysilicon membrane can be substantially converted to single crystal silicon by laser annealing.

The composition of the gas used to seal the channels may be adjusted to obtain a desired residual pressure level within the sealed cavities For example, in an oxidizing sealing technique, the water and oxygen trapped in the cavity will be substantially completely consumed in forming an oxide on the interior walls of the cavity, leaving a residual gas, e.g., nitrogen or argon, trapped in the cavity. Thus, the residual pressure in the cavity will be substantially the partial pressure of the "inert" gas as it existed in the oxydizing atmosphere. Similarly, where deposition of polysilicon from silane is utilized to seal the cavities, the silane may be mixed with an inert gas which will be trapped in the cavity as polysilicon is deposited on the interior walls of the cavity. The hydrogen gas trapped in the cavity from the decomposition of silane will diffuse through the walls of the cavity, leaving the heavier inert gas. Thus, the desired pressure level in the cavity can be selected by selecting the partial pressure of the inert gas in the ambient atmosphere during the sealing cycle. If desired, the cavity may also be maintained at a very low relative pressure if the atmosphere in the cavity during sealing is composed of a gas which will be substantially completely consumed by depositing out on the walls of the cavity or reacting with the silicon in the cavity.

As noted above, materials other than polysilicon can form the deposited layer. Any material which can be deposited from a gas or vapor phase to form a cohesive membrane structure may be utilized. By way of exemplification, but not limitation, these materials include silicon nitride which may be deposited by low pressure chemical vapor deposition (e.g., from a vapor phase of dichlorosilane and ammonia at 400 milliTorr at 800° C.), and aluminum which may be deposited by sputtering or metalorganic chemical vapor deposition (e.g., by decomposition of trimethylaluminum). If silicon nitride or a metal such as aluminum forms the deposited layer 32, the post 22 and ridges 27 may be formed of polysilicon, which is attacked by etchants which do not substantially affect silicon nitride or aluminum The channels in polysilicon cavity structures may be sealed by deposition of silicon nitride in the channels, and silicon nitride cavity structures may be sealed by deposition of polysilicon. In the former case, the layer of silicon nitride formed on the outer surface of the membrane of the cavity provides an excellent insulating surface on which electrically isolated circuit elements (e.g., piezoresistive polysilicon resistors) may be formed and provides control of the overall strain in the composite membrane. Of course, the substrate itself may be formed from various substrate materials commonly used in semiconductor processing, including, for example, crystalline silicon, germanium, sapphire, silicon on sapphire, spinel, silicon dioxide, and ceramic compositions.

Piezoresistive elements can be used as noted above to measure strain, with polysilicon resistors being particularly suited to incorporation in the devices of the present invention. It can be shown that the greatest sensitivity to pressure changes is obtained when the piezoresistors are mounted at the center of the edges of a square-type membrane. In general, polysilicon resistors mounted generally parallel to the membrane edge have very little strain sensitivity, while resistors mounted perpendicular to the edge provide reasonable strain sensitivity. It is possible to obtain polysilicon piezoresistors formed on the membrane which will have opposite changes in resistance with applied pressure by doping resistors formed at two opposite side edges of the membrane with one type of dopant, p or n, and the resistors at the other two sides with the opposite type of dopant. In this manner, it is possible to obtain a full active bridge on the membrane It is also possible to mount two of the bridge arms near the center of the membrane, which is a position of reduced pressure sensitivity but which provides opposite change in resistance with applied pressure to that obtained with resistors of the same dopant type mounted at the edges of the membrane.

As the membranes size is reduced, it is more difficult to align the resistors optically and to obtain accurate resistance values for the resistors mounted on the membranes. One manner in which the alignment problem can be minimized is to utilize piezoresistors mounted such that either end is at a zero strain point. One such position of zero strain is, of course, at a position off of the edge of the membrane where the membrane is affixed to the substrate. The other point of zero strain for a square membrane clamped at its edges is a position about a third of the way to the center of the membrane from an edge. Thus, it is feasible to produce serpentine resistors which traverse these two points and which would have good tolerance to alignment error. By utilizing a serpentine configuration for the resistors, the effect of resistor length is increased, thereby increasing the total resistance and decreasing the power dissipation by heating in the resistor.

The optimal geometry of a planar processed pressure transducer yields the maximum strain variation with applied pressure, while keeping within the constraints imposed by the fabrication techniques and material properties. The strain sensitivity, and therefore the pressure sensitivity, is proportional to $a^2/Eh^2$, where h is the membrane thickness, a is the width of the membrane, and E is Young's Modulus. Thus, the smaller the thickness, and the larger the area of the membrane, the better the pressure sensitivity. However, the maximum stress due to bending is also proportional to $a^2/h^2$, and can be the limiting factor for maximizing pressure sensitivity, particularly for membranes which are made with a built-in tensile strain field. For a plate membrane formed with a built-in compressive strain field, the $a^2/h^2$ ratio is usually limited by buckling of the membrane. The maximum deflection occurs at the center of the membrane, and is proportional to $Qa^4/h^3$ so that, for a fixed ratio of a/h, the maximum deflection increases with increasing membrane a where Q is the applied pressure. The gap spacing between the membrane and the underlying substrate obviously provides a mechanical limit on the maximum deflection. By properly specifying the gap space, an effective overpressure stop can be provided. Preferably, the maximum deflection of the membrane to preserve linearity should be less than approximately one-fifth of the membrane thickness. Deflections greater than this may cause stretching of the middle plane of the membrane, resulting in non-linearity of strain with applied load. However, many devices fabricated with gaps even as large as the membrane thickness have demonstrated reasonably good linearity to the pressure at which the membrane touched the underlying substrate. The thickness of the membrane is preferably as small as possible for maximum strain sensitivity, while providing a membrane strong enough to remain intact during processing and thick enough and uniform enough not to bow when unloaded. The thickness of the gap itself between the membrane and the substrate should be small, to produce a transducer as small as possible. Gap thickness and membrane thickness are preferably small to reduce the material and time required to fabricate the devices. Preferably, the membrane width should be greater than ten times the thickness of the membrane to maintain linear and predictable variation of strain with pressure. The membrane width is also preferably large enough to allow strain sensitive resistors to be mounted on the membrane while allowing for reasonable alignment tolerances.

A processing sequence for forming a planar polysilicon transducer sealed with vapor deposited silicon nitride is illustrated in the views of FIGS. 13-33. In this technique, the post which defines the cavity area is grown into the substrate surface so that the resulting membrane is substantially coplanar with the supporting portions of the membrane that rest on the substrate. The silicon nitride layer provides dielectric isolation for polysilicon resistors. With reference to FIG. 13, the starting material comprises a crystalline silicon substrate 80. A 400 angstrom thick layer of silicon dioxide 81 is thermally grown on the wafer. A second thin layer of near stochiometric silicon nitride 82, about 400 angstroms thick, is then deposited. For example, the nitride may be deposited from a gas phase comprising a mixture of ammonia gas and dichlorosilane. As exemplary conditions, the ammonia gas may be provided at a flow rate of 160 milliliters per minute and the dicholorosilane at a flow rate of 38 milliliters per minute, at a pressure of approximately 150 milliTorr and a deposition temperature of 800° C. The first masking level which defines the cavity is then patterned and the nitride layer 84 is etched in a $CF_4/O_2$ plasma, followed by a HF etch of the oxide layer 81 to form an open area 83 defining the perimeters of the cavity, as shown in FIG. 14. The oxide layer forms an etched stop for the nitride etchant.

The substrate is then oxidized at, e.g., 1050° C. under wet nitrogen to provide a 7500 angstrom layer 84 of silicon dioxide, as shown in FIG. 15. The entire unpatterned substrate is then immersed in a HF solution to remove the oxide 84, leaving an indentation 86 in the substrate 80, as shown in FIG. 15. The wafer is then reoxidized at the same temperature and time under the same conditions to grow oxide in the indentation formed in the substrate. The result is an oxide filled indented post area 87 approximately 7500 angstroms thick, which has a top surface substantially at the level of the top surface of the substrate 80. The nitride layer 82 proves to be an effective oxidation barrier, oxidizing at less than 1 angstrom a minute at a temperature of 1050° C.

The layers 81 and 82 are then patterned and etched to open windows 88 in the nitride/oxide layer which exposes the silicon substrate at places where the membrane is to be anchored to the substrate. The remaining areas or islands 89 of nitride and oxide extend in a branched network pattern similar to the network of ridges 27 described above. The island areas 89 shown in FIG. 18 thus function as essentially the ridges 27 to act as forms for etchant channels, as described further below.

A layer 90 of LPCVD polysilicon (e.g. 2 microns thick) is then deposited on the substrate as shown in FIG. 19, with the portion of the polysilicon layer overlying the indented post 27 forming the insipient membrane 91. For example, a 2 micron thick layer of polysilicon may be deposited from silane gas at 635° C. for 100 minutes and then annealed at 1150° C. for 3 hours to reduce the residual strain field.

The polysilicon layer 90 is then patterned to form the transducer body and etched, as shown in FIG. 20, to define the body. The nitride layer 82 and oxide layer 81 form an etch stop for this etch, which is preferably a two-step etch. For example, $NF_3$ reactive ion etching may be used for the bulk of the cutting and the remaining polysilicon may be etched using a $CF_4/O_2$ plasma to obtain a uniform etch.

The entire wafer may then be immersed into concentrated hydrofluoric acid for a period of several hours to clear out all of the oxide and nitride on the wafer, including that in the inverted post 87. The result of this etching is shown in FIG. 21, in which etched channels 93 remain in place of the islands or ridges 89, and a cavity 94 remains in place of the inverted post 87. After the etch is completed, the portion of the polysilicon layer 90 defining the membrane 91 is free standing and unsupported over the cavity 94. As illustrated in the views of FIGS. 18-21, the ridges or islands 89 extend over the ingrown post 87 so that the etchant which etches through the ridges 89 can reach into and etch the area of the ingrown post 87. This occurs because the second oxidation of the wafer, illustrated in FIG. 17, causes the oxidation to proceed underneath the oxide layer 81 and nitride layer 82, as illustrated in FIG. 17. After the wafer is rinsed in distilled water and dried for 30 minutes under a vacuum, the membranes should be found to be flat and undistorted. A reactive sealing technique to seal the channels 93 may then begin.

Figure 22:
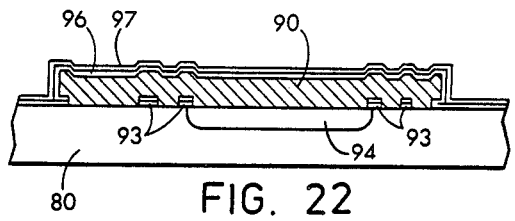

A second layer of oxide 96, for example about 400 angstroms thick, is grown at 800° C. for 40 minutes under an atmosphere of wet nitrogen. Thereafter a second layer 97 of low-strain LPCVD silicon nitride, also about 400 angstroms thick, is deposited. The oxide is also formed in the channels 93, to help those off the channels, as well as within the cavity 94 as oxygen within the cavity is consumed. In addition, if the channels 93 are not entirely sealed after the growth of the oxide layer, they would be completely sealed off when the nitride layer is deposited, as illustrated in FIG. 22, wherein the channels are completely sealed off from the atmosphere. The desired low strain nitride layer 97 can be achieved by using larger ratios of dichlorosilane to ammonia.

Figure 23:
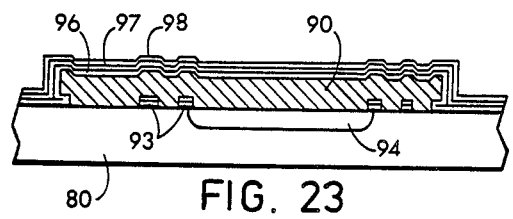

Immediately after the deposition of the silicon nitride layer, the Wafers are transferred to the LPCVD polysilicon deposition system where a layer 98 of polysilicon (e.g., about 5000 angstroms thick) is deposited, as illustrated in FIG. 23.

Several patterning steps then follow to properly dope the polysilicon resistors to be formed in the polysilicon layer 98. The resistors can be doped either n-type or p-type using boron or phosphorous dopants. By utilizing both types of dopants on a single membrane, fully active bridges on the membrane may be obtained. Alternatively, it is possible to form four serpentine resistors mounted symmetrically about the plate center and connected in series to provide the highest degree of alignment tolerance, the highest resistive value, and the best matching from membrane to membrane. Formation of such resistors is illustrated in the sequence of FIGS. 24-33.

Figure 24:
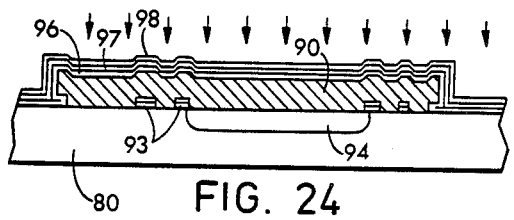
Figure 25:
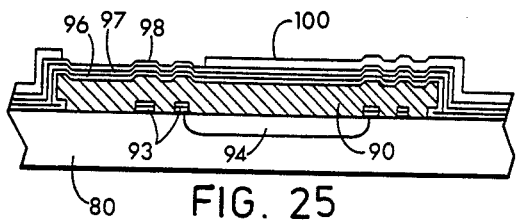
Figure 26:
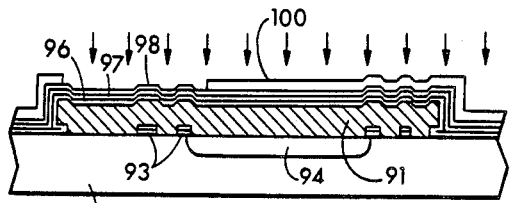
Figure 27:
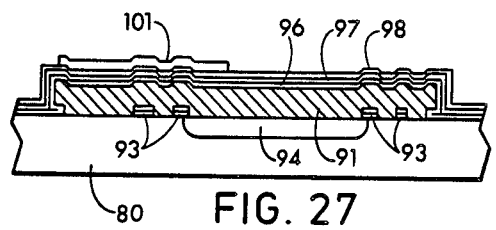
Figure 28:
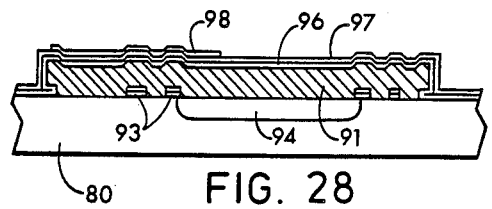
Figure 29:
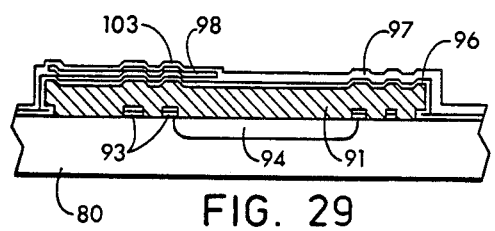

Initially, as shown in FIG. 24, a resistor implant of a single dopant is applied to the entire polysilicon layer 98. A photoresist 100, as shown in FIG. 25, is then applied to desired portions of the area of the polysilicon layer 98, and a further implant of dopant applied to the exposed areas of the layer 98, as illustrated in FIG. 26. This allows a heavier implant dosage in the contact areas and turn around points of the polysilicon resistors. The turnaround points are desired to have lower resistance so that their contribution to strain sensitivity is small. The photoresist 100 is then removed, and another layer of photoresist 101 is applied to the polysilicon layer over those areas of the layer that are to be retained, as illustrated in FIG. 27. An etchant is then applied to the wafer to etch away the polysilicon in all areas except that covered by the photoresist layer 101, and the photoresist is then removed to leave the structure illustrated in FIG. 28. The wafer is then exposed to an oxidizing ambient which results in the growth of an oxide layer 103, e.g., 400 angstroms thick, over the polysilicon and the slow growth of an oxide on the silicon nitride layer 97 (FIG. 29).

Figure 30:
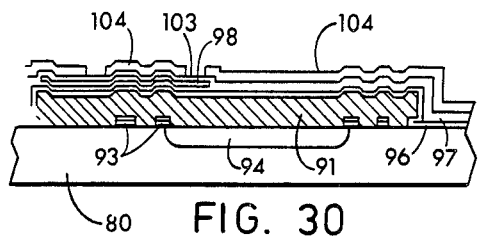
Figure 31:
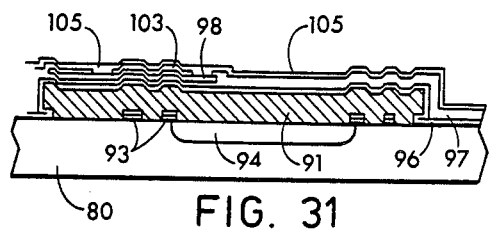

A photoresist layer 104 is then applied, leaving areas of the oxide layer 103 exposed where the contacts are to be formed, as shown in FIG. 30. An etchant is then applied to the wafer to etch through the portion of the layer 103 which is exposed, etching down to the polysilicon layer 98; the photoresist 104 is then removed, and a metal layer 105 (e.g., aluminum) deposited over the exposed surface, as illustrated in FIG. 31, including portions where the metal makes contact with the heavily doped portions of the polysilicon layer 98.

Figure 32:
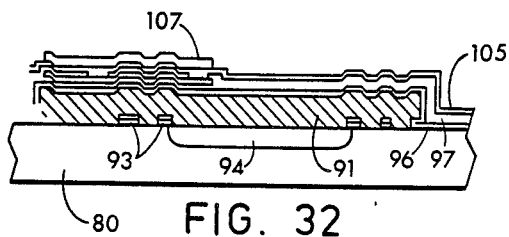
Figure 33:
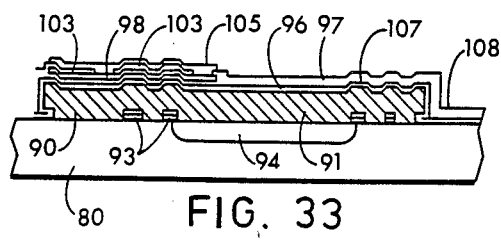

The surface of the metal is then patterned with a photoresist layer 107, as shown in FIG. 32, and an etchant applied to etch away the metal layer not covered by the photoresist, and the photoresist thereafter removed to leave the completed structure with the metalized conducting layers 105 in the proper pattern, as illustrated in FIG. 33. The metal surface layer 105 is then annealed to complete the fabrication sequence. The pressure transducer having the membrane 91 spanning the cavity 94 is now ready for bonding and testing.

Figure 34:
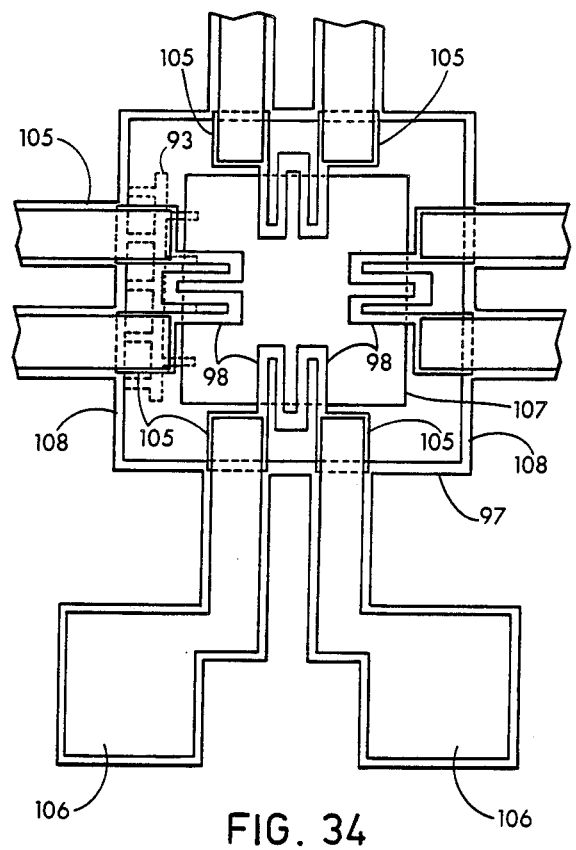
FIG. 34 is a plan view of a pressure sensor formed by the processing steps illustrated in FIGS. 13-33.

A top plan view of a pressure transducer formed as described above is shown in FIG. 34. As illustrated therein, the metal layer 105 extends out to contact pads 106 by which contacts can be made to the four serpentine resistors formed by the path of polysilicon resistor material 98 on the top of the membrane 91 over the insulating silicon nitride layer. The position of the boundary of the membrane 91 is illustrated by the line 107 in FIG. 34, and the boundary of the deposited polysilicon layer 90 remaining on the substrate as illustrated by the line 108 in FIG. 34. One of the networks of filled channels 93 is shown on one side of the membrane in dashed lines in FIG. 34, illustrating the relative position of the network of channels 93 with respect to the edge of the membrane 107 and the outer edge 108 of the polysilicon layer 90. The resistors 90 formed on the surface of the membrane 91 are well adapted to be connected in a bridge type configuration. If desired, the connections between the resistors can be made by metal layers extending directly between the adjacent layers 105, rather than requiring contacts between the pads 106.

The silicon nitride layer 97 acts as a dielectric isolation layer to isolate the polysilicon resistors 98. A layer of another insulator, e.g., aluminum oxide or silicon dioxide, may alternatively be used for this purpose. The device as described above has a lower profile on the surface of the substrate than devices formed in which the membrane extends up above the surface of the substrate, thereby reducing the moment caused by built-in stresses and a raised membrane. Planar devices are also found somewhat easier to pattern than the raised device.

It is understood that the invention is not confined to the particular construction and arrangement of parts or the particular steps herein illustrated and described, but embraces such modified forms thereof as come within the scope of the following claims.

What is claimed is:

1. A pressure transducer structure comprising:
   (a) a substrate having an upper surface;
   (b) a layer of soiled material on the substrate upper surface having a central portion defining a deformable membrane which is spaced from the substrate to define a cavity between the membrane and the substrate, and having peripheral portions bonded to the upper surface of the substrate with channels extending through the peripheral portions from the cavity to the perimeter of the layer; and
   (c) solid material deposited from a gas phase of the material in the channels and the cavity in the layer which seals the channels such that atmospheric gases cannot enter or exit the cavity through the channels.

2. The transducer structure of claim 1 including at least one piezoresistive element formed on the membrane whereby deflections Of the membrane can be detected by changes in the resistance of the piezoresistive element.

3. The transducer structure of claim 1 wherein the layer of solid material and the deposited solid material are polycrystalline silicon.

4. The transducer structure of claim 1 wherein the layer of solid material is selected from the group consisting of polycrystalline silicon and silicon nitride.

5. The transducer structure of claim 1 wherein the deposited material is selected from the group consisting of polycrystalline silicon and silicon nitride.

6. A pressure transducer structure comprising:
   (a) a silicon substrate with an upper surface;
   (b) a layer of polycrystalline silicon on the substrate upper surface having a central deformable membrane portion spaced from the substrate to define a cavity between the membrane and the substrate, and having peripheral portions bonded to the upper surface of the substrate with channels extending outwardly through the peripheral areas from the cavity to the perimeter of the polysilicon layer; and
   (c) silicon dioxide formed in the channels sealing off the channels so that atmospheric gases cannot enter or exit the cavity through the channels and a layer of silicon dioxide on the interior walls defining the cavity.

7. The transducer structure of claim 6 including at least one piezoresistive element formed on the membrane whereby deflection of the membrane can be detected by changes in the resistance of the piezoresistive elements.

8. A pressure transducer structure comprising:
   (a) a substrate having an upper surface;
   (b) a layer of solid material on the substrate upper surface having a central portion defining a deformable membrane which is spaced away from the portion of the substrate therebeneath to define a cavity, and having peripheral portions bonded to the surface of the substrate with channels extending through the peripheral portions from the cavity to the perimeter of the layer; and
   (c) insulating solid material deposited from a gas phase of the material in the channels in the layer which seals the channels such that atmospheric gases cannot enter or exit the cavity through the channels.

9. The transducer structure of claim 8 wherein the layer of solid material is polycrystalline silicon and the deposited solid material is silicon nitride.

10. The transducer structure of claim 8 including at least one piezoresistive element formed on the membrane whereby deflection of the membrane can be detected by changes in the resistance of the piezoresistive elements.

11. The pressure transducer of claim 8 wherein the channels which extend from the cavity to the perimeter of the layer do not extend in a straight line.

12. The pressure transducer of claim 11 in which a plurality of channels extend from the cavity to the periphery of the layer in a branched network 13. The pressure transducer of claim 8 the layer of solid material on the substrate which defines the deformable membrane is formed of polycrystalline silicon, wherein the solid material deposited from a gas phase to seal the channels is silicon nitride and further including a layer of silicon nitride deposited over the layer of polycrystalline silicon to form a non-conductive insulating layer, and including at least one piezoresistive element formed on the insulating silicon nitride surface such that deflections of the membrane can be detected by changes in the resistance of the piezoresistive element.

* * * * *

UNITED STATES PATENT AND TRADEMARK OFFICE
CERTIFICATE OF CORRECTION

PATENT NO. : 4,853,669
DATED : August 1, 1989
INVENTOR(S) : Henry Guckel and David W. Burns/WARF It is certified that error appears in the above-identified patent and that said Letters Patent is hereby corrected as shown below:

Column 1, line 9 "858,806" should be --855,806--.

Column 10, line 39 after "with increasing membrane" insert --width--.

Column 14, line 2 "soiled" should be --solid--.

Column 14, line 17 "Of" should be --of--.

Column 16, line 1 after "claim 8" insert --wherein--.

Signed and Sealed this

Eighteenth Day of August, 1992

Attest:

DOUGLAS B. COMER

Attesting Officer         Acting Commissioner of Patents and Trademarks